United States Patent
Chen et al.

(10) Patent No.: US 10,205,444 B2
(45) Date of Patent: Feb. 12, 2019

(54) PWM CONTROL METHOD FOR FIVE-LEVEL INVERTING CIRCUIT, CONTROL CIRCUIT AND INVERTER

(71) Applicant: SUNGROW POWER SUPPLY CO., LTD., Hefei, Anhui (CN)

(72) Inventors: Peng Chen, Anhui (CN); Jinhu Cao, Anhui (CN); Houlai Geng, Anhui (CN); Peng Wen, Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/664,583

(22) Filed: Jul. 31, 2017

(65) Prior Publication Data

US 2018/0159519 A1    Jun. 7, 2018

(30) Foreign Application Priority Data

Dec. 1, 2016 (CN) .......................... 2016 1 1092909

(51) Int. Cl.
*H03K 3/017* (2006.01)
*H03K 5/04* (2006.01)
(Continued)

(52) U.S. Cl.
CPC ............... *H03K 7/08* (2013.01); *H02M 1/08* (2013.01); *H02M 1/38* (2013.01); *H02M 7/483* (2013.01);
(Continued)

(58) Field of Classification Search
USPC ...................................................... 327/175
See application file for complete search history.

(56) References Cited

U.S. PATENT DOCUMENTS

| | | | | |
|---|---|---|---|---|
| 4,348,734 A | * | 9/1982 | Dougherty | H02M 7/487 |
| | | | | 708/276 |
| 9,583,946 B2 | * | 2/2017 | Fornage | H02J 3/383 |

(Continued)

FOREIGN PATENT DOCUMENTS

| CN | 101262180 A | 9/2008 |
|---|---|---|
| CN | 103595281 A | 2/2014 |

(Continued)

OTHER PUBLICATIONS

Extended European Search Report corresponding to Application No. 17183996.2-1201; dated Jan. 26, 2018.

(Continued)

*Primary Examiner* — Adam Houston
(74) *Attorney, Agent, or Firm* — Cantor Colburn LLP

(57) ABSTRACT

A pulse width modulation (PWM) control method for a five-level inverting circuit is provided. The five-level inverting circuit includes a first capacitor, a second capacitor, a third capacitor and first to eighth switch branches. In this PWM control method, the control logic is set to enable the first and fourth switch branches to be turned on in a complementary manner, the second and fifth switch branches to be turned on in a complementary manner, the third and sixth switch branches to be turned on in a complementary manner, and the seventh and eighth switch branches to be turned on in a complementary manner, and enable the first and second switch branches to be turned on in an interlocking manner, and the sixth and fifth switch branches to be turned on in an interlocking manner.

15 Claims, 11 Drawing Sheets

(51) Int. Cl.
*H03K 7/08* (2006.01)
*H02M 1/08* (2006.01)
*H02M 1/38* (2007.01)
*H02M 7/483* (2007.01)
*H02M 7/487* (2007.01)
*H02M 7/5395* (2006.01)
*H03K 19/20* (2006.01)

(52) U.S. Cl.
CPC .......... *H02M 7/487* (2013.01); *H02M 7/5395* (2013.01); *H03K 19/20* (2013.01)

(56) References Cited

U.S. PATENT DOCUMENTS

| | | | | |
|---|---|---|---|---|
| 9,843,271 | B1* | 12/2017 | Nikitin | H02M 7/217 |
| 9,960,592 | B2* | 5/2018 | Liu | G01R 31/025 |
| 9,979,319 | B1* | 5/2018 | Jiao | H02M 1/32 |
| 2005/0281065 | A1* | 12/2005 | Nojima | H02H 7/1227 |
| | | | | 363/98 |
| 2010/0327799 | A1* | 12/2010 | Broussard | H02M 7/003 |
| | | | | 318/807 |
| 2014/0239910 | A1* | 8/2014 | Tsai | H02J 7/007 |
| | | | | 320/134 |
| 2016/0022891 | A1* | 1/2016 | Bluvshtein | A61M 1/127 |
| | | | | 600/16 |
| 2016/0043659 | A1 | 2/2016 | Xu et al. | |
| 2016/0118972 | A1 | 4/2016 | Li et al. | |
| 2016/0268924 | A1 | 9/2016 | Fu et al. | |
| 2016/0308373 | A1* | 10/2016 | Geske | H02M 1/00 |
| 2016/0314914 | A1* | 10/2016 | Li | H02M 3/158 |
| 2017/0098993 | A1* | 4/2017 | Scherbaum | H02M 1/42 |
| 2017/0104424 | A1* | 4/2017 | Shen | H02M 7/487 |
| 2017/0229871 | A1* | 8/2017 | Liu | H02M 7/537 |
| 2017/0244325 | A1* | 8/2017 | Carralero | H02M 3/33507 |
| 2018/0159519 | A1* | 6/2018 | Chen | H02M 1/08 |

FOREIGN PATENT DOCUMENTS

| | | |
|---|---|---|
| CN | 104270027 A | 1/2015 |
| CN | 105226978 A | 1/2016 |
| CN | 105337521 A | 2/2016 |
| CN | 205265554 U | 5/2016 |
| JP | 2012210066 A | 10/2012 |

OTHER PUBLICATIONS

SIPO First Office Action corresponding to Application No. 201611092909.X; dated Jun. 19, 2018.

* cited by examiner

US 10,205,444 B2

PWM CONTROL METHOD FOR FIVE-LEVEL INVERTING CIRCUIT, CONTROL CIRCUIT AND INVERTER

CROSS REFERENCE TO RELATED APPLICATION

The present invention claims priority under 35 U.S.C. § 119 to Chinese Patent Application No. 201611092909.X, filed on Dec. 1, 2016, the entire contents of which are incorporated herein by reference.

FIELD

The disclosure relates to the technical field of photovoltaic new energy, and particularly to a PWM control method for a five-level inverting circuit, a control circuit and an inverter.

BACKGROUND

In recent years, multilevel output has becoming a commonly used technology in the field of middle-high voltage high power frequency conversion. The active neutral point clamped multilevel circuit is a commonly used multilevel inverting circuit. In the active neutral point clamped multilevel circuit, at least one floating capacitor is provided at a certain position, such that the level of the circuit is clamped, thereby generating different output levels.

FIG. 1 illustrates a commonly used five-level inverting circuit, which includes multiple switch transistors and freewheel diodes, where the multiple switch transistors are turned on and turned off according to preset logics, thereby implementing inversion. However, the five-level inverting circuit includes three direct current (DC) capacitors. If some of the switch transistors are turned on simultaneously, the DC capacitor may be short circuited, thereby resulting in a great short-circuit current in the loop, thus the switch transistor may be damaged.

Therefore, providing a PWM control method for a five-level inverting circuit in order to prevent the DC capacitor from being short circuited is a major technical issue to be solved by a person skilled in the art.

SUMMARY

A PWM control method for a five-level inverting circuit, a control circuit and an inverter are provided according to the present disclosure, in order to solve the technical issue in the conventional technology that the DC capacitor in the five-level inverting circuit is susceptible to be short circuited.

In order to achieve the above object, the following technical solutions are provided according to the present disclosure.

It is provided a PWM control method for a five-level inverting circuit, applied to a five-level inverting circuit. The five-level inverting circuit includes a first capacitor, a second capacitor, a third capacitor, a first switch branch, a second switch branch, a third switch branch, a fourth switch branch, a fifth switch branch, a sixth switch branch, a seventh switch branch and an eighth switch branch, where a branch forming by connecting the first capacitor and the second capacitor in series is connected between a positive output terminal and a negative output terminal of a direct current (DC) power supply, the first switch branch is connected between a first terminal of the third capacitor and the positive output terminal of the DC power supply, the second switch branch and the third switch branch are connected between a second terminal of the first capacitor and the first terminal of the third capacitor, the fourth switch branch and the fifth switch branch are connected between a first terminal of the second capacitor and a second terminal of the third capacitor, the sixth switch branch is connected between the second terminal of the third capacitor and the negative output terminal of the DC power supply, the seventh switch branch is connected between the first terminal of the third capacitor and an output terminal of the five-level inverting circuit, and the eighth switch branch is connected between the second terminal of the third capacitor and the output terminal of the five-level inverting circuit; and the PWM control method includes:

performing a complementary processing to enable a first control signal and a fourth control signal to be complementary to each other, where the first control signal controls to turn on or turn off the first switch branch, and the fourth control signal controls to turn on or turn off the fourth switch branch;

performing a complementary processing to enable a fifth control signal and a second control signal to be complementary to each other, where the fifth control signal controls to turn on or turn off the fifth switch branch, and the second control signal controls to turn on or turn off the second switch branch;

performing a complementary processing to enable a third control signal and a sixth control signal to be complementary to each other, where the third control signal controls to turn on or turn off the third switch branch, and the sixth control signal controls to turn on or turn off the sixth switch branch;

performing a complementary processing to enable a seventh control signal and an eighth control signal to be complementary to each other, where the seventh control signal controls to turn on or turn off the seventh switch branch, and the eighth control signal controls to turn on or turn off the eighth switch branch; and performing an interlocking processing to enable the first control signal and the second control signal to be interlocked with each other, and performing an interlocking processing to enable the sixth control signal and the fifth control signal to be interlocked with each other.

Preferably, the PWM control method further includes:

on reception of a first preset instruction, controlling the first switch branch, the fourth switch branch, the third switch branch, the sixth switch branch, the seventh switch branch and the eighth switch branch to be turned off, controlling the second switch branch to maintain a current state of the second switch branch, and controlling the fifth switch branch to maintain a current state of the fifth switch branch.

Preferably, the PWM control method further includes:

on reception of a second preset instruction, controlling the first switch branch, the second switch branch, the third switch branch, the fourth switch branch, the fifth switch branch, the sixth switch branch, the seventh switch branch and the eighth switch branch to be turned off.

It is provided a control circuit, including a first reversing dead zone circuit, a second reversing dead zone circuit, a third reversing dead zone circuit, a fourth reversing dead zone circuit, a first interlocking circuit and a second interlocking circuit, where an input terminal of the first reversing dead zone circuit is fed with a first control signal, and an output terminal of the first reversing dead zone circuit outputs a fourth control signal;

an input terminal of the second reversing dead zone circuit is fed with a fifth control signal, and an output terminal of the second reversing dead zone circuit outputs a second control signal;

a first input terminal of the first interlocking circuit is fed with the first control signal, a second input terminal of the first interlocking circuit is connected with the output terminal of the second reversing dead zone circuit, the first interlocking circuit is configured to output the first control signal when the first control signal and the second control signal are valid simultaneously;

an input terminal of the third reversing dead zone circuit is fed with a third control signal;

a first input terminal of the second interlocking circuit is fed with the fifth control signal, a second input terminal of the second interlocking circuit is connected with an output terminal of the third reversing dead zone circuit, the second interlocking circuit is configured to output a sixth control signal when the fifth control signal and the sixth control signal are valid simultaneously; and an input terminal of the fourth reversing dead zone circuit is fed with a seventh control signal, and an output terminal of the fourth reversing dead zone circuit outputs an eighth control signal.

Preferably, the control circuit further includes:

a wave blocking circuit connected with a control signal output terminal of the control circuit and configured to control the first control signal, the fourth control signal, the third control signal, the sixth control signal, the seventh control signal and the eighth control signal to be turning-off signals, control the second control signal to maintain a current state of the second control signal, and control the fifth control signal to maintain a current state of the fifth control signal, on reception of a first wave blocking enable signal.

Preferably, the wave blocking circuit is further configured to:

control the first control signal, the second control signal, the third control signal, the fourth control signal, the fifth control signal, the sixth control signal, the seventh control signal and the eighth control signal to be turning-off signals on reception of a second wave blocking enable signal.

Preferably, the wave blocking circuit includes a first enable circuit, a second enable circuit, a third enable circuit, a fourth enable circuit, a fifth enable circuit, a sixth enable circuit, a seventh enable circuit and an eighth enable circuits, where a first input terminal of the first enable circuit is connected with the output terminal of the first reversing dead zone circuit, a first input terminal of the second enable circuit is connected with an output terminal of the first interlocking circuit, a first input terminal of the third enable circuit is connected with the output terminal of the second reversing dead zone circuit, a first input terminal of the fourth enable circuit is fed with the fifth control signal, a first input terminal of the fifth enable circuit is connected with an output terminal of the second interlocking circuit, a first input terminal of the sixth enable circuit is fed with the third control signal, a first input terminal of the seventh enable circuit is fed with the seventh control signal, a first input terminal of the eighth enable circuit is connected with the output terminal of the fourth reversing dead zone circuit, a second input terminal of the first enable circuit, a second input terminal of the second enable circuit, a second input terminal of the fifth enable circuit, a second input terminal of the sixth enable circuit, a second input terminal of the seventh enable circuit and a second input terminal of the eighth enable circuit are fed with the first wave blocking enable signal, and a third input terminal of the first enable circuit, a third input terminal of the second enable circuit, a third input terminal of the third enable circuit, a third input terminal of the fourth enable circuit, a third input terminal of the fifth enable circuit, a third input terminal of the sixth enable circuit, a third input terminal of the seventh enable circuit and a third input terminal of the eighth enable circuit are fed with a second wave blocking enable signal.

Preferably, the reversing dead zone circuit includes a delay circuit and a NOT gate, where an input terminal of the NOT gate serves as the input terminal of the reversing dead zone circuit, the delay circuit is connected in series with the NOT gate, and an output terminal of the NOT gate serves as the output terminal of the reversing dead zone circuit.

Preferably, the interlocking circuit includes an AND gate and an OR gate, where a first input terminal of the AND gate is connected with a first terminal of the OR gate, and the terminal at which the first input terminal of the AND gate is connected with the first terminal of the OR gate serves as the first input terminal of the interlocking circuit;

a second input terminal of the AND gate serves as the second input terminal of the interlocking circuit; and an output terminal of the AND gate is connected with a second input terminal of the OR gate, and an output terminal of the OR gate serves as the output terminal of the interlocking circuit.

It is provided an inverter, including any one of the above control circuits.

A PWM control method for a five-level inverting circuit is provided according to the present disclosure. The PWM control method is applied to a five-level inverting circuit including a first capacitor, a second capacitor, a third capacitor and first to eighth switch branches. In this PWM control method, the control logic is set to enable the first switch branch and the fourth switch branch to be turned on in a complementary manner, the second switch branch and the fifth switch branch to be turned on in a complementary manner, the third switch branch and the sixth switch branch to be turned on in a complementary manner, and the seventh switch branch and the eighth switch branch to be turned on in a complementary manner, and enable the first switch branch and the second switch branch to be turned on in an interlocking manner, and the sixth switch branch and the fifth switch branch to be turned on in an interlocking manner. In this way, the five-level inverting circuit operates stably, thereby avoiding the problem that one of the first capacitor, the second capacitor and the third capacitor is susceptible to be short circuited due to certain switch branches being turned on simultaneously.

In addition, in the PWM control method for a five-level inverting circuit according to the present disclosure, on reception of the first preset instruction, the first switch branch, the fourth switch branch, the third switch branch, the sixth switch branch, the seventh switch branch and the eighth switch branch are controlled to be turned off, and the second switch branch and the fifth switch branch are controlled to maintain current states. Since the second switch branch or the fifth switch branch are turned on while other switch branches are turned off, voltage clamping can be implemented, thereby solving the problem that, when the output level of the five-level inverting circuit switches between two non-neighboring levels, a commutation loop may have a long path, which results in breakdown of the switch transistor in the switch branch.

BRIEF DESCRIPTION OF THE DRAWINGS

The drawings to be used in the description of the embodiments or the conventional technology will be described briefly as follows, so that the technical solutions according to the embodiments of the present disclosure or according to the conventional technology will become clearer. It is apparent that the drawings in the following description only illustrate some embodiments of the present disclosure. For those skilled in the art, other drawings may be obtained according to these drawings without any creative work.

DETAILED DESCRIPTION OF THE EMBODIMENTS

To make the above object, features and advantages of the present disclosure more apparent and easier to be understood, particular embodiments of the disclosure are illustrated in detail in conjunction with the drawings hereinafter.

A PWM control method for a five-level inverting circuit is provided according to the present disclosure, in order to solve the technical issue in the conventional technology that the DC capacitor in the five-level inverting circuit is susceptible to be short circuited.

Figure 2:
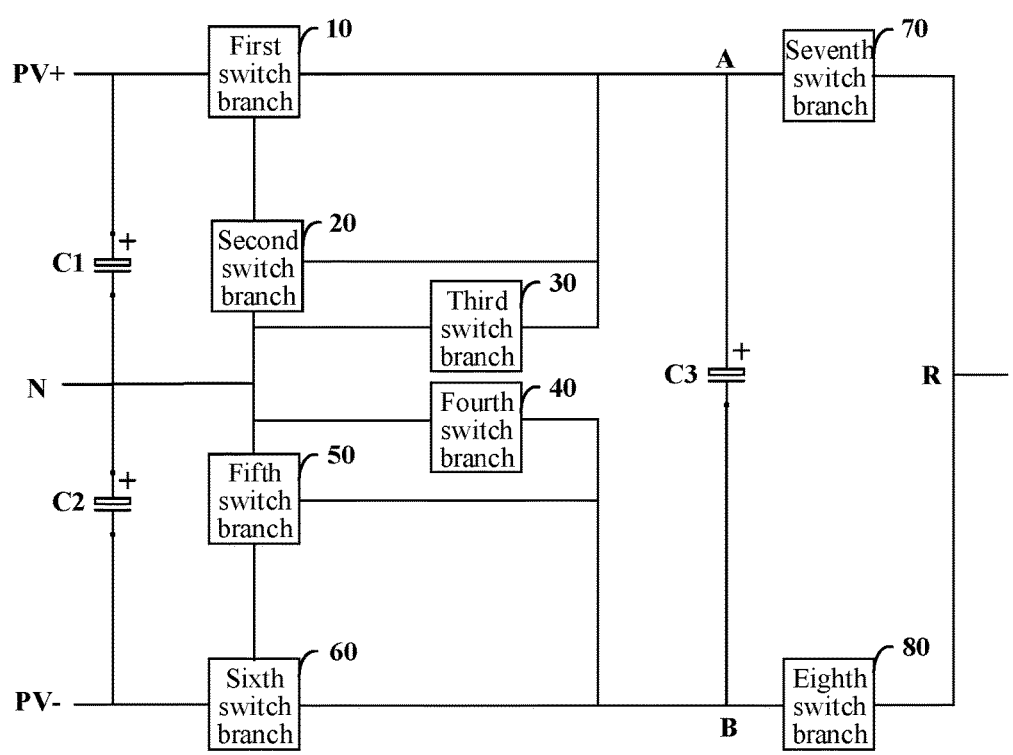
FIG. 2 is a schematic structural diagram of another five-level inverting circuit according to the conventional technology.

The PWM control method is applied to a five-level inverting circuit. As shown in FIG. 2, the five-level inverting circuit includes a first capacitor C1, a second capacitor C2, a third capacitor C3, a first switch branch 10, a second switch branch 20, a third switch branch 30, a fourth switch branch 40, a fifth switch branch 50, a sixth switch branch 60, a seventh switch branch 70 and an eighth switch branch 80.

A branch forming by connecting the first capacitor C1 and the second capacitor C2 in series is connected between a positive output terminal PV+ and a negative output terminal PV− of a DC power supply. The first switch branch 10 is connected between a first terminal A of the third capacitor C3 and the positive output terminal PV+ of the DC power supply. The second switch branch 20 and the third switch branch 30 are connected between a second terminal N of the first capacitor C1 and the first terminal A of the third capacitor C3. The fourth switch branch 40 and the fifth switch branch 50 are connected between a first terminal N of the second capacitor C2 and a second terminal B of the third capacitor C3. The sixth switch branch 60 is connected between the second terminal B of the third capacitor C3 and the negative output terminal PV− of the DC power supply. The seventh switch branch 70 is connected between the first terminal A of the third capacitor C3 and an output terminal R of the five-level inverting circuit. The eighth switch branch 80 is connected between the second terminal B of the third capacitor C3 and the output terminal R of the five-level inverting circuit.

In order to ensure normal operation of the above five-level inverting circuit, turning on and turning off of the switch branches need to be controlled. For example, the first switch branch 10 and the second switch branch 20 are required to not be turned on simultaneously, the first switch branch 10 and the fourth switch branch 40 are required to not be turned on simultaneously, the first switch branch 10 and the sixth switch branch 60 are required to not be turned on simultaneously, the second switch branch 20 and the fifth switch branch 50 are required to not be turned on simultaneously, the third switch branch 30 and the sixth switch branch 60 are required to not be turned on simultaneously, the fifth switch branch 50 and the sixth switch branch 60 are required to not be turned on simultaneously, and the seventh switch branch 70 and the eighth switch branch 80 are required to not be turned on simultaneously. Once any two switch branches, which are required to not be turned on simultaneously as described above, are turned on simultaneously, a corresponding capacitor is short circuited, and the circuit may be destroyed. For example, when the seventh switch branch 70 and the eighth switch branch 80 are turned on simultaneously, the third capacitor C3 is short circuited; and when the first switch branch 10 and the second switch branch 20 are turned on simultaneously, the first capacitor C1 is short circuited.

Therefore, a PWM control method is provided according to this embodiment, which includes:

performing a complementary processing to enable a first control signal and a fourth control signal to be complementary to each other, the first control signal controlling to turn on or turn off the first switch branch 10, and the fourth control signal controlling to turn on or turn off the fourth switch branch 40;

performing a complementary processing to enable a fifth control signal and a second control signal to be complementary to each other, the fifth control signal controlling to turn on or turn off the fifth switch branch 50, and the second control signal controlling to turn on or turn off the second switch branch 20;

performing a complementary processing to enable a third control signal and a sixth control signal to be complementary to each other, the third control signal controlling to turn on or turn off the third switch branch 30, and the sixth control signal controlling to turn on or turn off the sixth switch branch 60;

performing a complementary processing to enable a seventh control signal and an eighth control signal to be complementary to each other, the seventh control signal controlling to turn on or turn off the seventh switch branch 70, and the eighth control signal controlling to turn on or turn off the eighth switch branch 80; and performing an interlocking processing to enable the first control signal and the second control signal to be interlocked with each other, and performing an interlocking processing to enable the sixth control signal and the fifth control signal to be interlocked with each other.

It is to be noted that, two control signals being complementary to each other indicates that the two control signals are inverted with respect to each other. For example, the first control signal is complementary to the fourth control signal, thus when the first control signal is at a high level, the fourth control signal is at a low level; and when the first control signal is at a low level, the fourth control signal is at a high level. Therefore, when the first control signal controls the first switch branch 10 to be turned on, the fourth switch branch 40 is turned off; and when the first switch branch 10 is turned off, the fourth switch branch 40 is turned on.

As can be seen, with the above PWM control method, in the five-level inverting circuit, the first switch branch 10 and the fourth switch branch 40 are not turned on simultaneously, the second switch branch 20 and the fifth switch branch 50 are not turned on simultaneously, the third switch branch 30 and the sixth switch branch 60 are not turned on simultaneously, and the seventh switch branch 70 and the eighth switch branch 80 are not turned on simultaneously. In addition, the interlocking processing is performed on the first control signal and the second control signal such that the first control signal is disabled when the first control signal and the second control signal are valid simultaneously, and the interlocking processing is performed on the sixth control signal and the fifth control signal such that the sixth control signal is disabled when the sixth control signal and the fifth control signal are valid simultaneously.

In this solution, a first switch transistor in the first switch branch, a fourth switch transistor in the fourth switch branch, a third switch transistor in the third switch branch, a sixth switch transistor in the sixth switch branch, a seventh switch transistor in the seventh switch branch and an eighth switch transistor in the eighth switch branch are high-frequency switching transistors; a second switch transistor in the second switch branch and a fifth switch transistor in the fifth switch branch are power-frequency switching transistors. Therefore, the high-frequency switching transistor is disabled when the first control signal and the second control signal are valid simultaneously, thereby providing protection for the switch transistors.

In addition, in the PWM control method according to this embodiment, on reception of a first preset instruction, the first switch branch, the fourth switch branch, the third switch branch, the sixth switch branch, the seventh switch branch and the eighth switch branch are controlled to be turned off, and the second switch branch is controlled to maintain a current state of the second switch branch and the fifth switch branch is controlled to maintain a current state of the fifth switch branch.

The reason for this is that, since when the output level of the five-level inverting circuit switches between two non-neighboring levels, a commutation loop may have a long path, which results in breakdown of the switch transistor in the switch branch. In this embodiment, since the second switch branch and the fifth switch branch are turned on while the other switch branches are turned off, voltage clamping can be implemented, thereby enabling the output level of the five-level inverting circuit to switch between neighboring levels.

In addition, on the basis of the above, in this embodiment, on reception of a second preset instruction, the first to eighth switch branches are controlled to be turned off That is, the second preset instruction may be a shut-down instruction which instructs all of the switch branches to be turned off when the five-level inverting circuit needs to stop operating.

Figure 1:
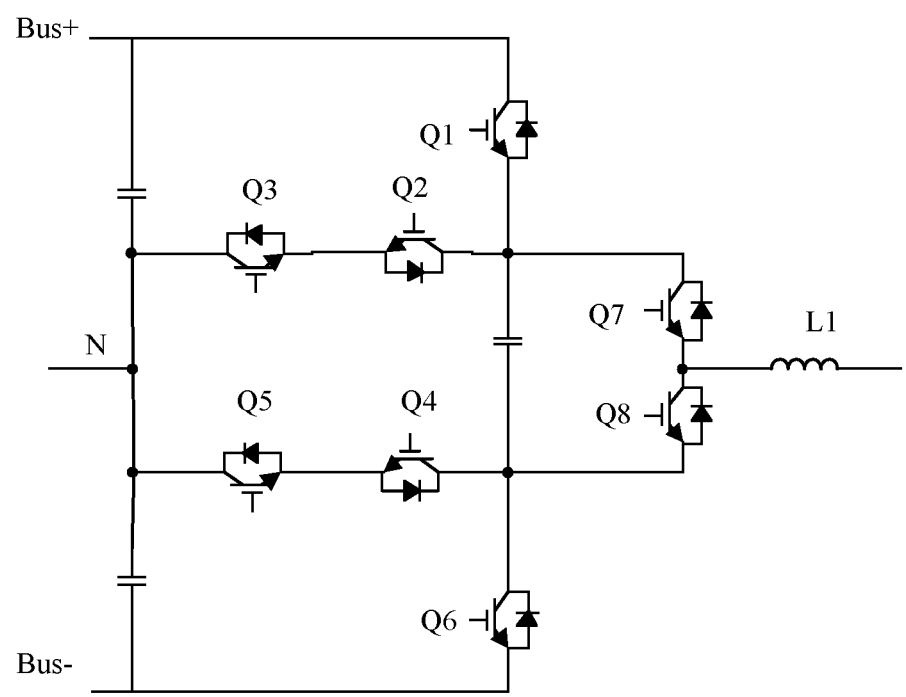
FIG. 1 is a schematic structural diagram of a five-level inverting circuit according to the conventional technology.
Figure 3:
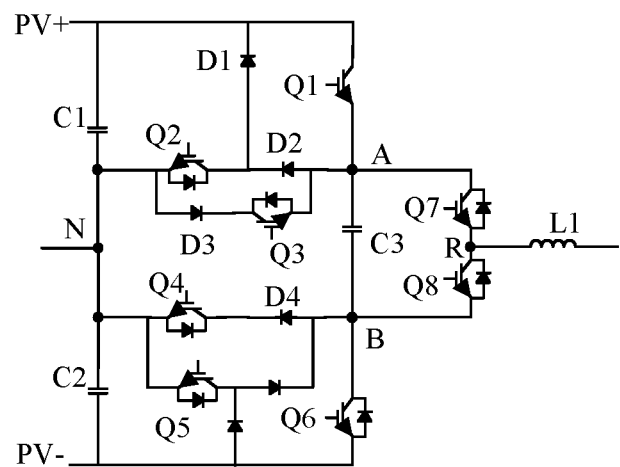
FIG. 3 is a schematic structural diagram of another five-level inverting circuit according to the conventional technology.
Figure 4:
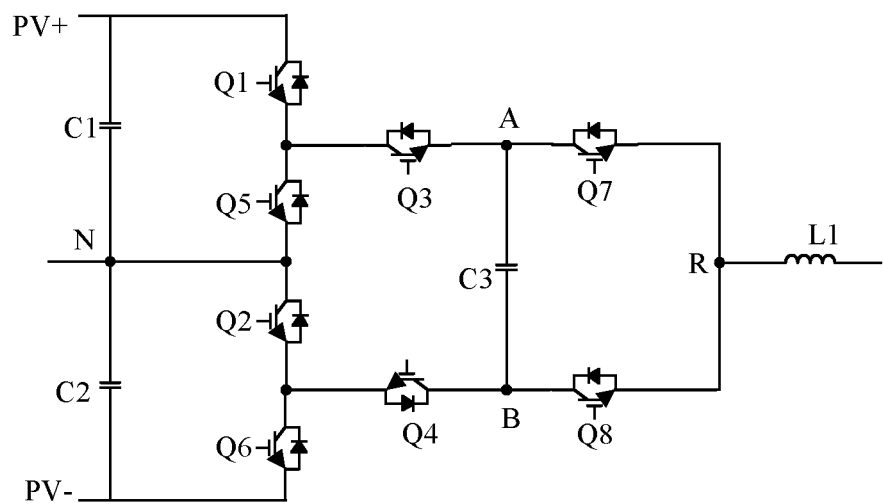
FIG. 4 is a schematic structural diagram of another five-level inverting circuit according to the conventional technology.

It is to be noted that, FIG. 2 is a schematic diagram illustrating only a principle of the five-level inverting circuit. The five-level inverting circuit may be implemented to have the structure of the circuit implementation as shown in any one of FIGS. 1, 3 and 4, or may be another five-level circuit which has same switch paths.

Figure 5:
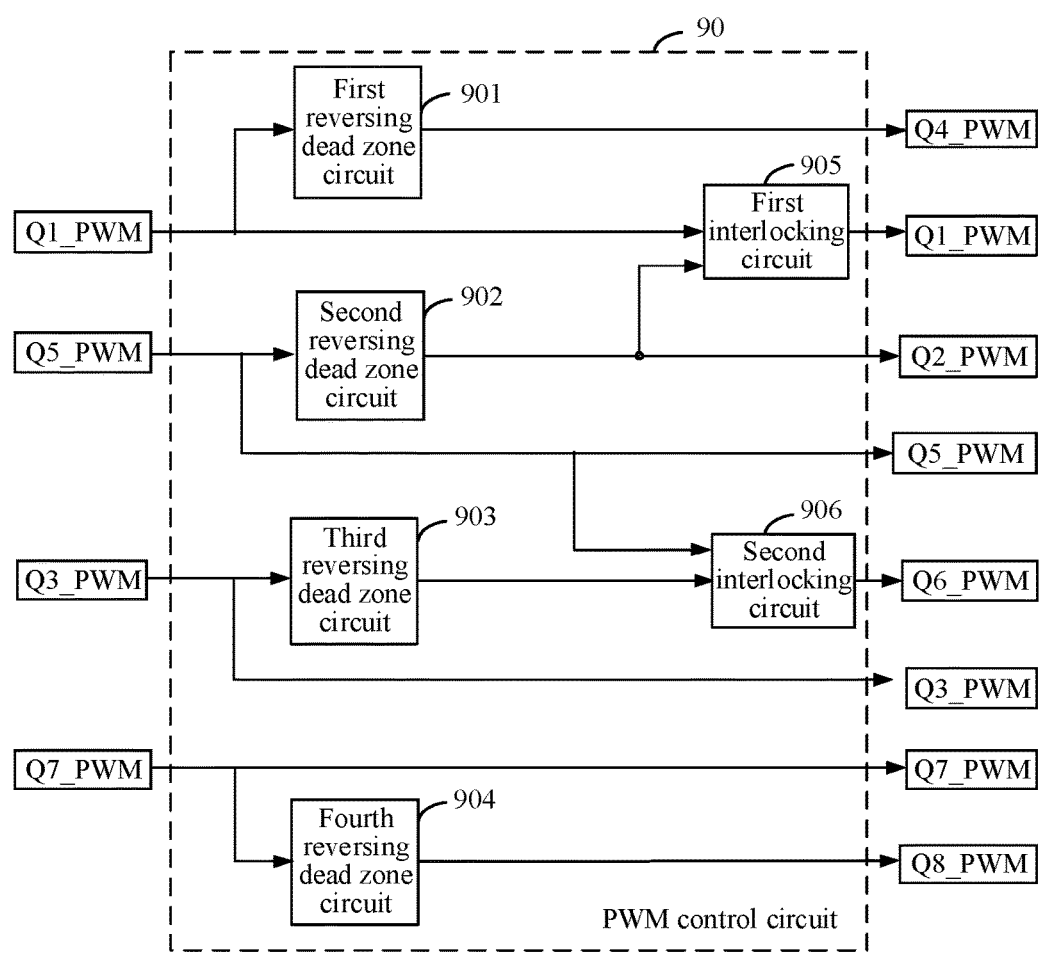
FIG. 5 is a schematic structural diagram of a control circuit according to an embodiment of the present disclosure.

Based on the above PWM control method, a control circuit for implementing the above PWM control method is further provided according to an embodiment of the present disclosure. As shown in FIG. 5, the PWM control circuit 90 includes a first reversing dead zone circuit 901, a second reversing dead zone circuit 902, a third reversing dead zone circuit 903, a fourth reversing dead zone circuit 904, a first interlocking circuit 905 and a second interlocking circuit 906.

An input terminal of the first reversing dead zone circuit 901 is fed with a first control signal Q1_PWM, and an output terminal of the first reversing dead zone circuit 901 outputs a fourth control signal Q4_PWM.

An input terminal of the second reversing dead zone circuit 902 is fed with a fifth control signal Q5_PWM, and an output terminal of the second reversing dead zone circuit 902 outputs a second control signal Q2_PWM.

A first input terminal of the first interlocking circuit 905 is fed with the first control signal Q1_PWM, a second input terminal of the first interlocking circuit 905 is connected with the output terminal of the second reversing dead zone circuit 902, the first interlocking circuit 905 is configured to output the first control signal Q1_PWM when the first control signal Q1_PWM and the second control signal Q2_PWM (acquired by the second reversing dead zone circuit 902 complementing the fifth control signal Q5_PWM) are valid simultaneously.

An input terminal of the third reversing dead zone circuit 903 is fed with a third control signal Q3_PWM.

A first input terminal of the second interlocking circuit 906 is fed with the fifth control signal Q5_PWM, a second input terminal of the second interlocking circuit 906 is connected with an output terminal of the third reversing dead zone circuit 903, the second interlocking circuit 906 is configured to output a sixth control signal Q6_PWM (acquired by the third reversing dead zone circuit 903 complementing the third control signal Q3_PWM) when the fifth control signal Q5_PWM and the sixth control signal Q6_PWM are valid simultaneously.

An input terminal of the fourth reversing dead zone circuit 904 is fed with a seventh control signal Q7_PWM, and an output terminal of the fourth reversing dead zone circuit 904 outputs an eighth control signal Q8_PWM.

In summary, control signals of the first to eighth switch branches perform output control according to a certain logic relationship, thereby preventing the capacitor from being short circuited.

Figure 6:
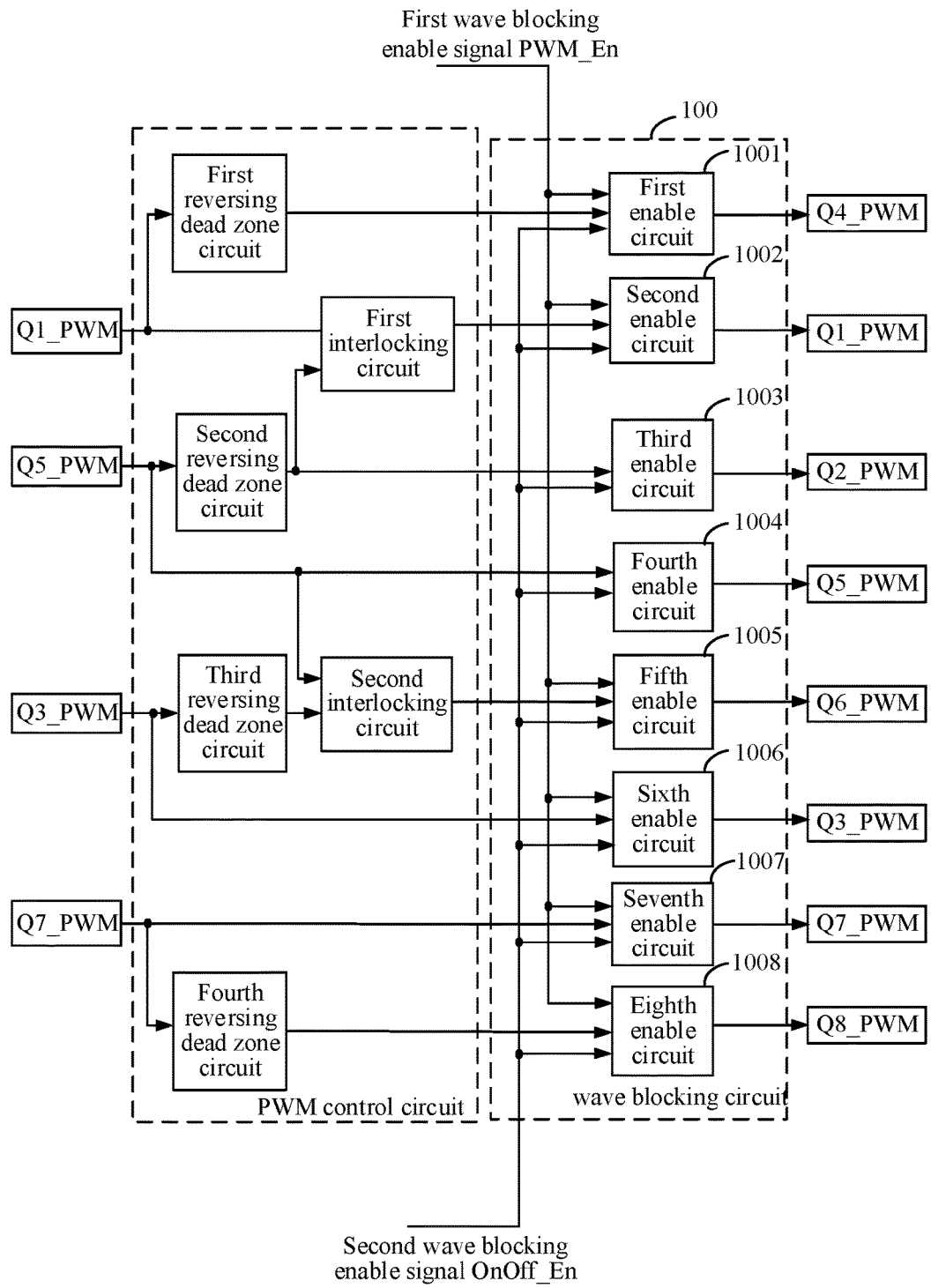
FIG. 6 is a schematic structural diagram of a control circuit according to another embodiment of the present disclosure.

In addition, on the basis of the above embodiment, as shown in FIG. 6, the control circuit further includes a wave blocking circuit 100. The wave blocking circuit is connected with a control signal output terminal of the control circuit and is configured to control the first control signal Q1_PWM, the fourth control signal Q4_PWM, the third control signal Q3_PWM, the sixth control signal Q6_PWM, the seventh control signal Q7_PWM and the eighth control signal Q8_PWM to be turning-off signals, and control the second control signal Q2_PWM to maintain a current state of the second control signal Q2_PWM and control the fifth control signal Q5_PWM to maintain a current state of the fifth control signal Q5_PWM, on reception of a first wave blocking enable signal PWM_En.

Since the second switch branch and the fifth switch branch are turned on while the other switch branches are turned off, voltage clamping can be implemented, thereby solving the problem that, when the output level of the five-level inverting circuit switches between two non-neighboring levels, a commutation loop may have a long path, which results in breakdown of the switch transistor in the switch branch.

Preferably, the wave blocking circuit 100 is further configured to control the first to eighth control signals to be turning-off signals on reception of a second wave blocking enable signal OnOff_En. That is, at this time, all of the first control signal Q1_PWM, the second control signal Q2_PWM, the third control signal Q3_PWM, the fourth control signal Q4_PWM, the fifth control signal Q5_PWM, the sixth control signal Q6_PWM, the seventh control signal Q7_PWM and the eighth control signal Q8_PWM are turning-off signals.

On the basis of the above embodiment, as shown in FIG. 6, a circuit implementation of the wave blocking circuit is provided according to this embodiment. The wave blocking circuit includes a first enable circuit 1001, a second enable circuit 1002, a third enable circuit 1003, a fourth enable circuit 1004, a fifth enable circuit 1005, a sixth enable circuit 1006, a seventh enable circuit 1007 and an eighth enable circuits 1008.

A first input terminal of the first enable circuit 1001 is connected with the output terminal of the first reversing dead zone circuit. A first input terminal of the second enable circuit 1002 is connected with an output terminal of the first interlocking circuit. A first input terminal of the third enable circuit 1003 is connected with the output terminal of the second reversing dead zone circuit. A first input terminal of the fourth enable circuit 1004 is fed with the fifth control signal. A first input terminal of the fifth enable circuit 1005 is connected with an output terminal of the second interlocking circuit. A first input terminal of the sixth enable circuit 1006 is fed with the third control signal. A first input terminal of the seventh enable circuit 1007 is fed with the seventh control signal. A first input terminal of the eighth enable circuit 1008 is connected with the output terminal of the fourth reversing dead zone circuit.

A second input terminal of the first enable circuit 1001, a second input terminal of the second enable circuit 1002, a second input terminal of the fifth enable circuit 1005, a second input terminal of the sixth enable circuit 1006, a second input terminal of the seventh enable circuit 1007 and a second input terminal of the eighth enable circuit 1008 are fed with the first wave blocking enable signal PWM_En.

A third input terminal of the first enable circuit 1001, a third input terminal of the second enable circuit 1002, a third input terminal of the third enable circuit 1003, a third input terminal of the fourth enable circuit 1004, a third input terminal of the fifth enable circuit 1005, a third input terminal of the sixth enable circuit 1006, a third input terminal of the seventh enable circuit 1007 and a third input terminal of the eighth enable circuit 1008 are fed with the second wave blocking enable signal OnOff_En.

Figure 7:
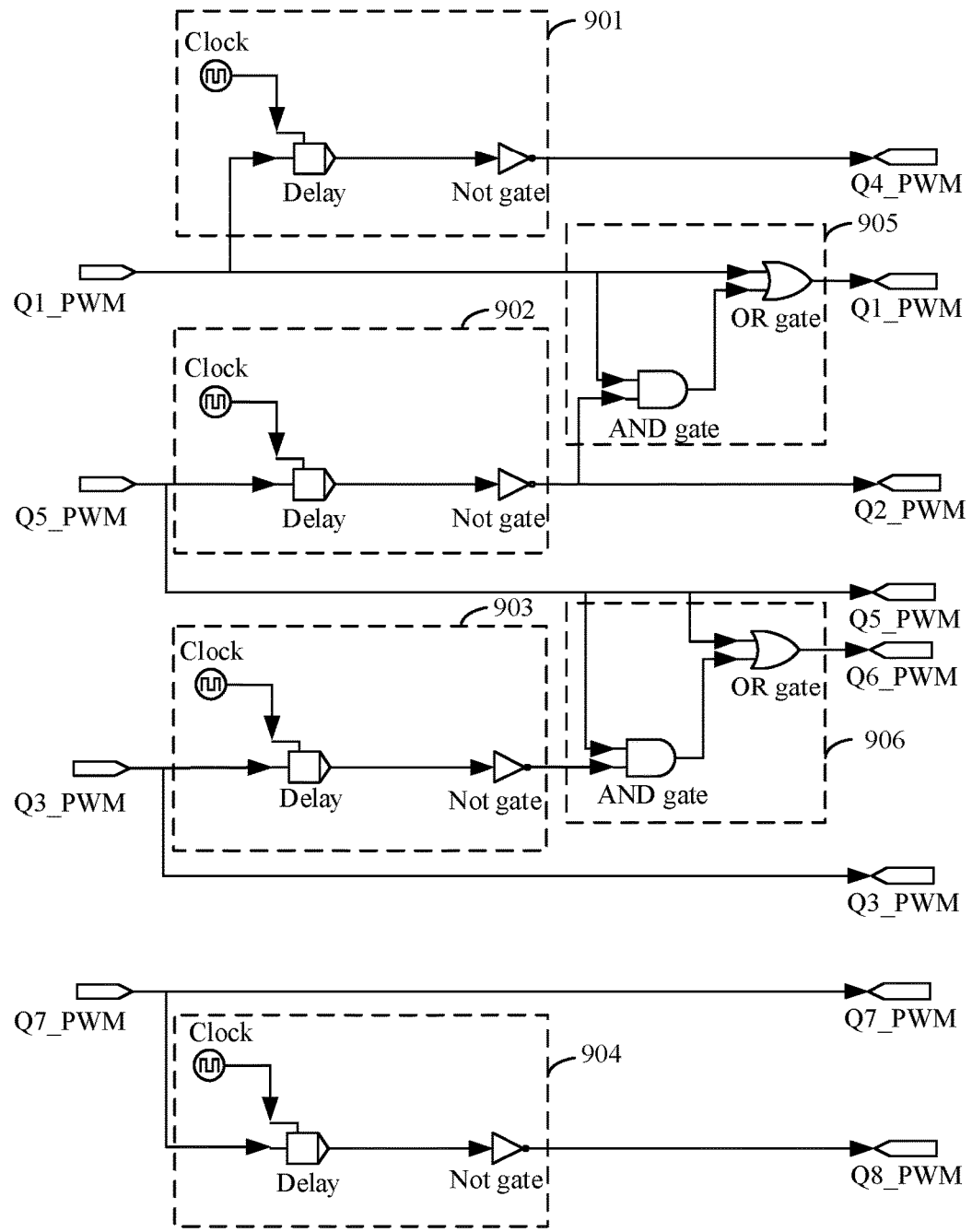
FIG. 7 is a schematic structural diagram of a control circuit according to another embodiment of the present disclosure.

In addition, circuit implementations of the reversing dead zone circuit and the interlocking circuit are provided according to this embodiment. As shown in FIG. 7, the reversing dead zone circuit 901 includes a delay circuit and a NOT gate. An input terminal of the NOT gate serves as the input terminal of the reversing dead zone circuit. The delay circuit is connected in series with the NOT gate. An output terminal of the NOT gate serves as the output terminal of the reversing dead zone circuit.

The interlocking circuit 905 includes an AND gate and an OR gate. A first input terminal of the AND gate is connected with a first terminal of the OR gate, the terminal at which the first input terminal of the AND gate is connected with the first terminal of the OR gate serves as the first input terminal of the interlocking circuit. A second input terminal of the AND gate serves as the second input terminal of the interlocking circuit. An output terminal of the AND gate is connected with a second input terminal of the OR gate. An output terminal of the OR gate serves as the output terminal of the interlocking circuit.

Figure 8:
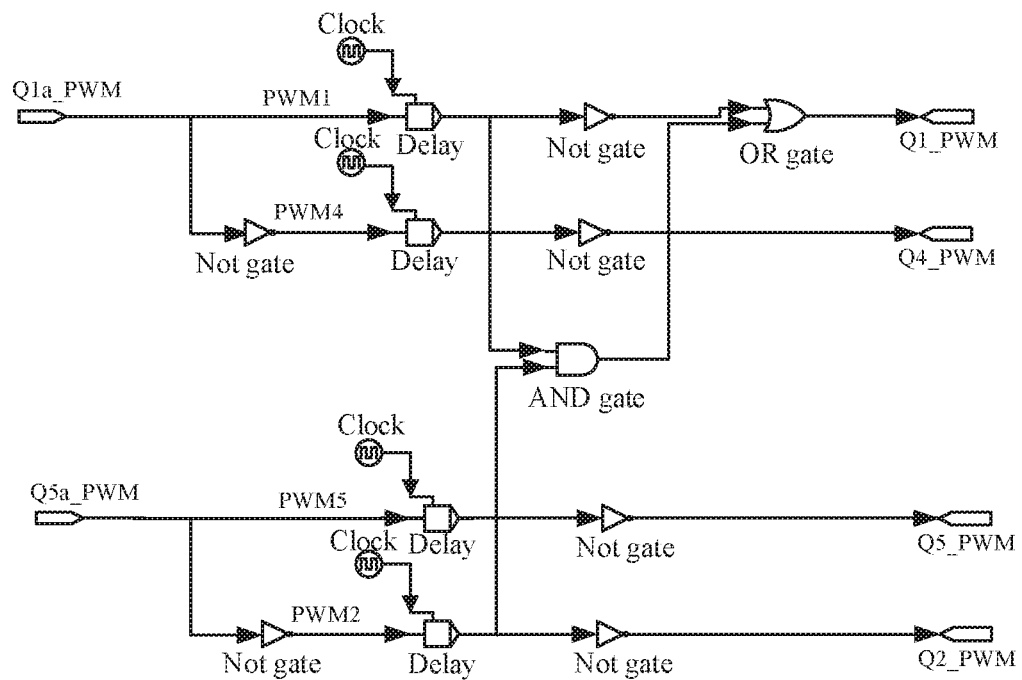
FIG. 8 is a schematic structural diagram of a control circuit according to another embodiment of the present disclosure.

In addition, the circuit implementation as shown in FIG. 8 may also be adopted, where signal Q1a_PWM is a reverse signal with respect to the signal Q1_PWM. Therefore, in FIG. 8, each branch is additionally provided with one NOT gate as compared with the circuit implementation shown in FIG. 7. The operation principle of the circuit implementation shown in FIG. 8 is the same as that of the circuit implementation shown in FIG. 7.

In summary, a PWM control method for a five-level inverting circuit is provided according to the present disclosure. The PWM control method is applied to a five-level inverting circuit including a first capacitor, a second capacitor, a third capacitor and first to eighth switch branches. In this PWM control method, the control logic is set to enable the first switch branch and the fourth switch branch to be turned on in a complementary manner, the second switch branch and the fifth switch branch to be turned on in a complementary manner, the third switch branch and the sixth switch branch to be turned on in a complementary manner, and the seventh switch branch and the eighth switch branch to be turned on in a complementary manner, and enable the first switch branch and the second switch branch to be turned on in an interlocking manner, and the sixth switch branch and the fifth switch branch to be turned on in an interlocking manner. In this way, the five-level inverting circuit operates stably, thereby avoiding the problem that one of the first capacitor, the second capacitor and the third capacitor is susceptible to be short circuited due to certain switch branches being turned on simultaneously.

On the basis of the above embodiment, an inverter is further provided according to this embodiment. The inverter includes any one of the above control circuits.

Figure 9A:
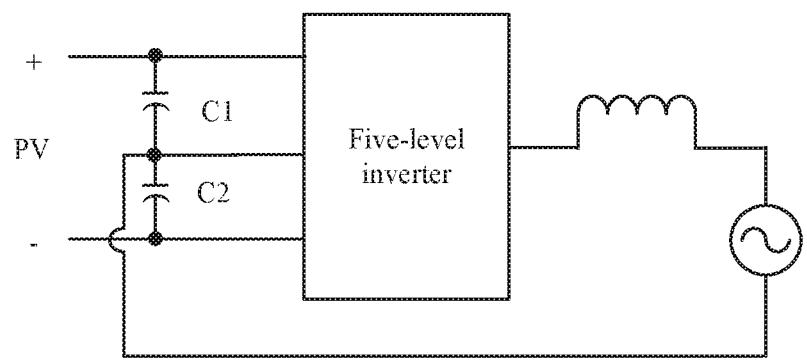
FIG. 9A and FIG. 9B are schematic diagrams illustrating application circuits of a five-level inverter according to an embodiment of the present disclosure.
Figure 9B:
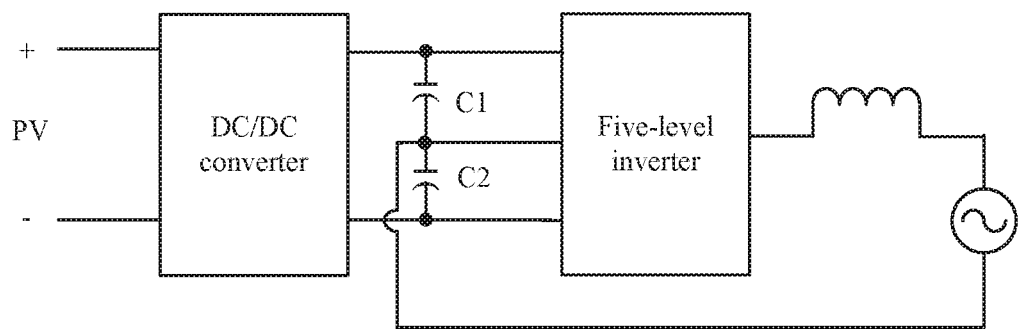

In actual applications, as shown in FIG. 9A, a second input terminal and an output terminal of the five-level inverter may be connected with the power grid via an electronic component such as an inductor (or a capacitor). A DC/DC converter may also be additionally provided at the front end of the five-level inverter for converting voltages, thereby extending the range of the input voltage of the five-level inverter. Alternatively, as shown in FIG. 9B, a DC/DC converter is additionally provided at the front end of the five-level inverter for converting voltages, and the second input terminal and the output terminal of the five-level invertor are connected with the power grid via an electronic component such as an inductor (or a capacitor).

Figure 10A:
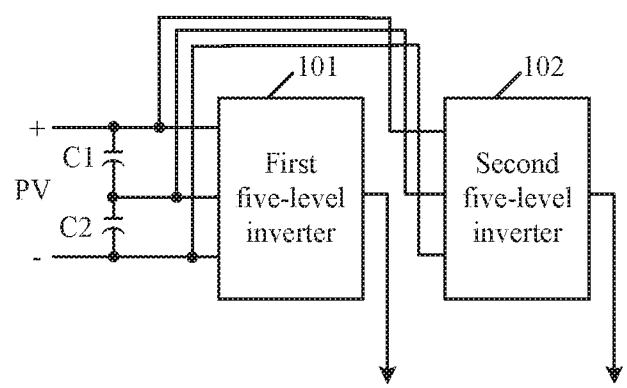
FIG. 10A and FIG. 10B are schematic diagrams illustrating application circuits of a two-phase five-level inverter according to an embodiment of the present disclosure.

An application circuit of a five-level inverter is further provided according to an embodiment of the present disclosure. As shown in FIG. 10A, which is a topology diagram of a two-phase five-level inverter according to this embodiment, the two-phase five-level inverter includes two five-level inverters as described in the above embodiment, which are a first five-level inverter 101 and a second five-level inverter 102. First input terminals of the first five-level inverter 101 and the second five-level inverter 102 are connected with a positive terminal of a DC power supply PV. Second input terminals of first five-level inverter 101 and the second five-level inverter 102 are connected with a connection point of a first capacitor C1 and a second capacitor C2. Third input terminals of the first five-level inverter 101 and the second five-level inverter 102 are connected with a negative terminal of the DC power supply. Output terminals of the first five-level inverter 101 and the second five-level inverter 102 serve as two alternating current (AC) output terminals of the two-phase five-level inverter.

Specifically, the first five-level inverter 101 is modulated using a first sine wave, and the second five-level inverter 102 is modulated using a second sine wave. A phase difference between the first sine wave and the second sine wave is 180 degrees or 0 degree.

Figure 11A:
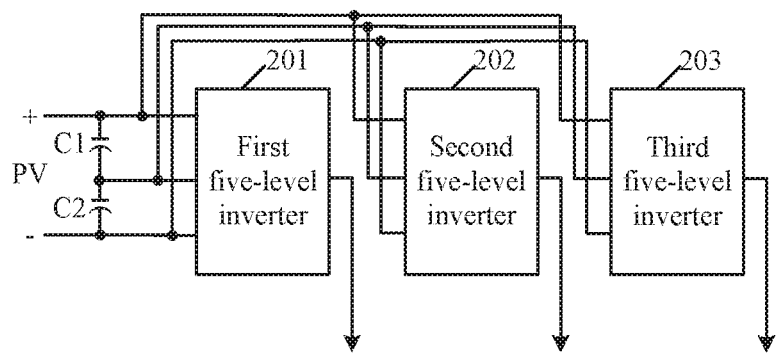
FIG. 11A and FIG. 11B are schematic diagrams illustrating application circuits of a three-phase three-wire five-level inverter according to an embodiment of the present disclosure.

An application circuit of a five-level inverter is further provided according to an embodiment of the present disclosure. As shown in FIG. 11A, which is a topology diagram of a three-phase three-wire five-level inverter according to this embodiment, the three-phase three-wire five-level inverter includes three five-level inverters as described in the above embodiment, which are a first five-level inverter 201, a second five-level inverter 202 and a third five-level inverter 203. First input terminals of the first five-level inverter 201, the second five-level inverter 202 and the third five-level inverter 203 are connected with a positive terminal of a DC power supply PV. Second input terminals of first five-level inverter 201, the second five-level inverter 202 and the third five-level inverter 203 are connected with a connection point of a first capacitor C1 and a second capacitor C2. Third input terminals of the first five-level inverter 201, the second five-level inverter 202 and the third five-level inverter 203 are connected with a negative terminal of the DC power supply. Output terminals of the first five-level inverter 201, the second five-level inverter 202 and the third five-level inverter 203 serve as three AC output terminals of the three-phase three-line five-level inverter.

Specifically, the first five-level inverter 201 is modulated using a first sine wave, the second five-level inverter 202 is modulated using a second sine wave, and the third five-level inverter 203 is modulated using a third sine wave. A phase difference between the first sine wave and the second sine wave, a phase difference between the second sine wave and the third sine wave and a phase difference between the third sine wave and the first sine wave are 120 degrees.

Figure 12A:
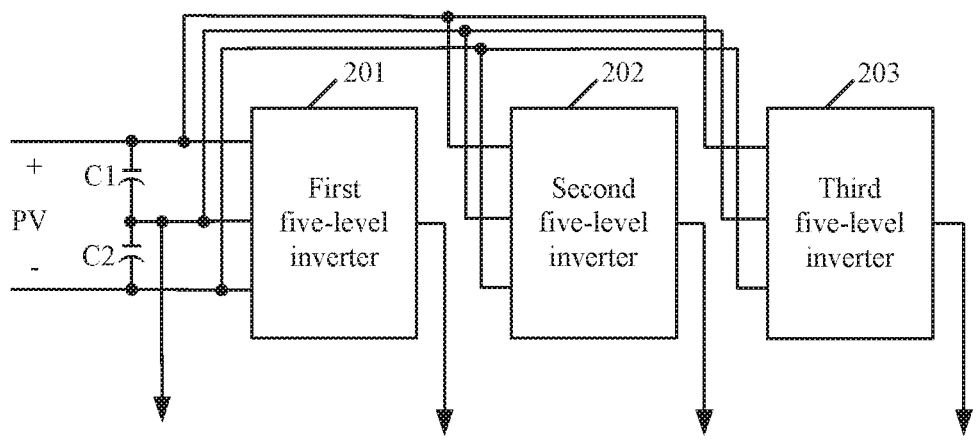
FIG. 12A and FIG. 12B are schematic diagrams illustrating application circuits of a three-phase four-wire five-level inverter according to an embodiment of the present disclosure.

An application circuit of a five-level inverter is further provided according to an embodiment of the present disclosure. As shown in FIG. 12A, which is a topology diagram of a three-phase four-wire five-level inverter according to this embodiment, the three-phase four-wire five-level inverter includes three five-level inverters as described in the above embodiment, which are a first five-level inverter 201, a second five-level inverter 202 and a third five-level inverter 203. First input terminals of the first five-level inverter 201, the second five-level inverter 202 and the third five-level inverter 203 are connected with a positive terminal of a DC power supply PV. Second input terminals of first five-level inverter 201, the second five-level inverter 202 and the third five-level inverter 203 are connected with a connection point of a first capacitor C1 and a second capacitor C2. Third input terminals of the first five-level inverter 201, the second five-level inverter 202 and the third five-level inverter 203 are connected with a negative terminal of the DC power supply. Output terminals of the first five-level inverter 201, the second five-level inverter 202 and the third five-level inverter 203 serve as three AC output terminals of the three-phase four-line five-level inverter. The connection point of the first capacitor C1 and the second capacitor C2 serves as a fourth output terminal of the three-phase four-line five-level inverter, and is connected with the three AC output terminals via the power grid and an electronic component such as an inductor (or a capacitor).

Specifically, the first five-level inverter 201 is modulated using a first sine wave, the second five-level inverter 202 is modulated using a second sine wave, and the third five-level inverter 203 is modulated using a third sine wave. A phase difference between the first sine wave and the second sine wave, a phase difference between the second sine wave and the third sine wave and a phase difference between the third sine wave and the first sine wave are 120 degrees.

Figure 10B:
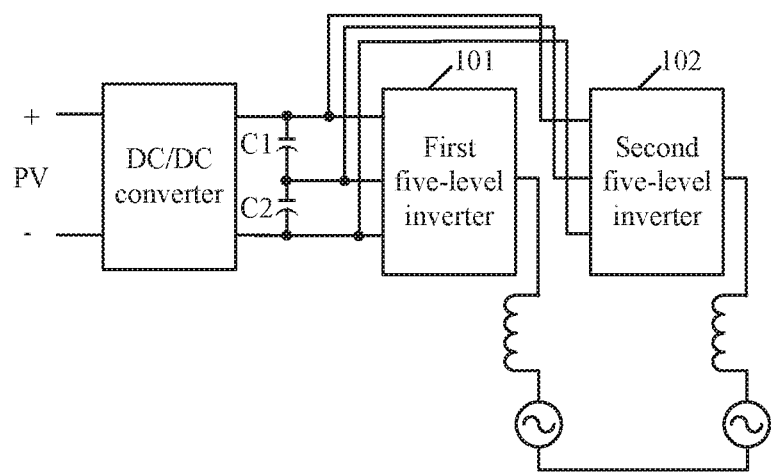
Figure 11B:
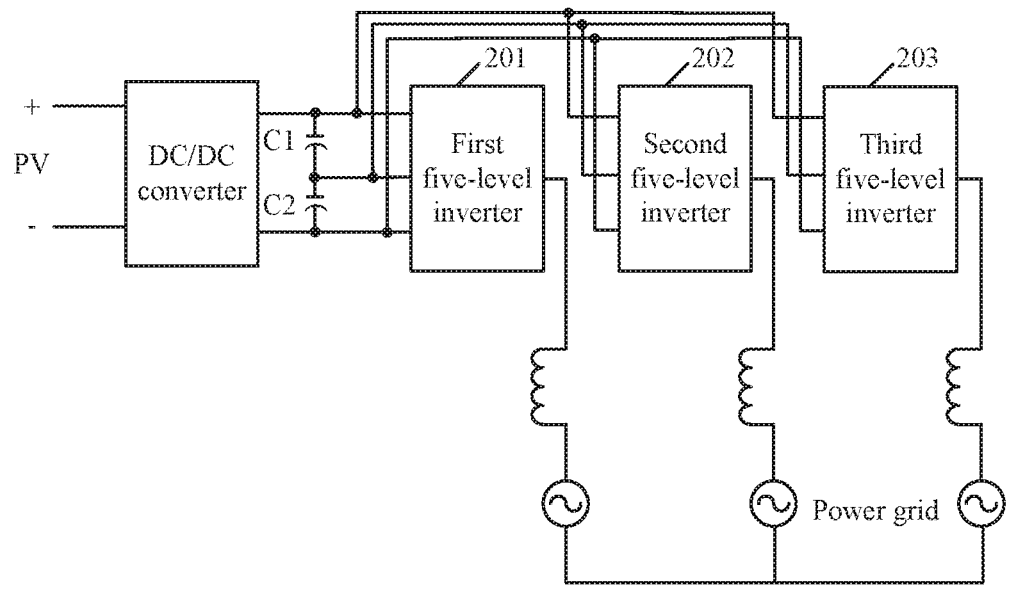
Figure 12B:
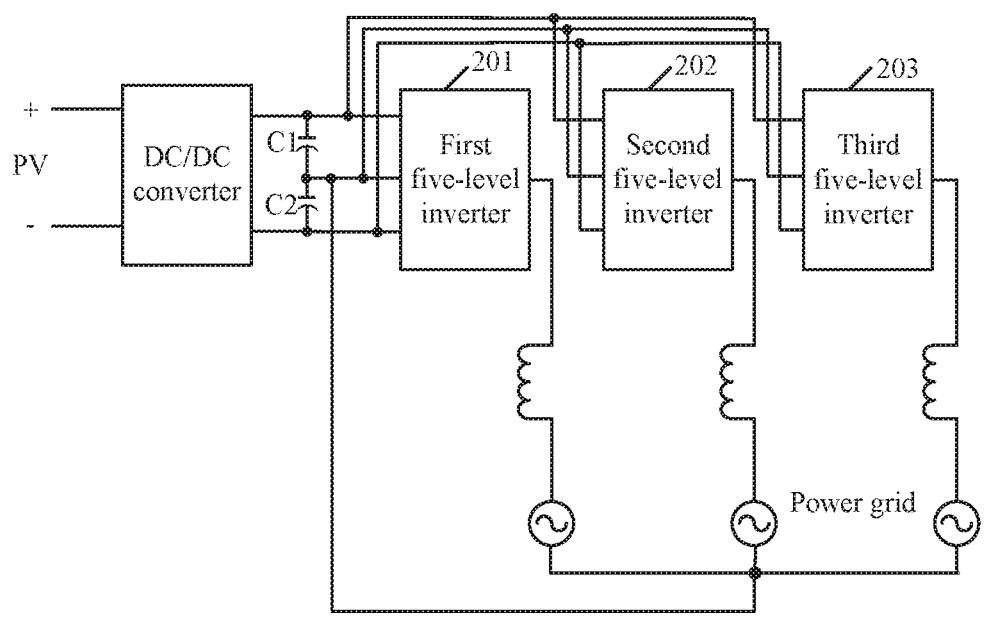

In actual applications, a DC/DC converter may also be additionally provided at the front end of the application circuit of the five-level inverter for converting voltages, thereby extending the range of the input voltage of the application circuit of the five-level inverter. AC output terminals of the application circuit of the five-level invertor may be connected with the power grid via an electronic component such as an inductor (or a capacitor). Alternatively, as shown in FIGS. 10B, 11B and 12B, a DC/DC converter is additionally provided at the front end of each of the application circuits of the five-level inverter for converting voltages, and the AC output terminals of each of the application circuits of the five-level invertor are connected with the power grid via an electronic component such as an inductor.

The application circuits of the five-level invertor in the above embodiments are applicable to a photovoltaic power generation system. Correspondingly, the DC power supply is a photovoltaic battery assembly. Alternatively, the above application circuits of the five-level inverter are also applicable to other power generation systems, and the present disclosure is not limited thereto.

It is to be noted that, the five-level inverter according to the embodiments of the present disclosure achieves the effect of preventing the capacitor from being short circuited. It should be understood that, the two-phase five-level inverter, the three-phase three-line five-level inverter and the three-phase four-line five-level inverter including the five-level inverter also have the above advantage.

What is described above is only preferred embodiments of the present disclosure and is not intended to limit the present disclosure in any way. The preferred embodiments of the present disclosure are disclosed above, which should not be interpreted as limiting the present disclosure. Numerous alternations, modifications, and equivalents can be made to the technical solutions of the present disclosure by those skilled in the art in light of the methods and technical content disclosed herein without deviation from the scope of the present disclosure. Therefore, any alternations, modifications, and equivalents made to the embodiments above according to the technical essential of the present disclosure without deviation from the content of the present disclosure should fall within the scope of protection of the present disclosure.

The invention claimed is:

1. A pulse width modulation (PWM) control method for a five-level inverting circuit, applied to a five-level inverting circuit comprising a first capacitor, a second capacitor, a third capacitor, a first switch branch, a second switch branch, a third switch branch, a fourth switch branch, a fifth switch branch, a sixth switch branch, a seventh switch branch and an eighth switch branch, a branch forming by connecting the first capacitor and the second capacitor in series being connected between a positive output terminal and a negative output terminal of a direct current (DC) power supply, the first switch branch being connected between a first terminal of the third capacitor and the positive output terminal of the DC power supply, the second switch branch and the third switch branch being connected between a second terminal of the first capacitor and the first terminal of the third capacitor, the fourth switch branch and the fifth switch branch being connected between a first terminal of the second capacitor and a second terminal of the third capacitor, the sixth switch branch being connected between the second terminal of the third capacitor and the negative output terminal of the DC power supply, the seventh switch branch being connected between the first terminal of the third capacitor and an output terminal of the five-level inverting circuit, and the eighth switch branch being connected between the second terminal of the third capacitor and the output terminal of the five-level inverting circuit; and the PWM control method comprising:

performing a complementary processing to enable a first control signal and a fourth control signal to be complementary to each other, the first control signal controlling to turn on or turn off the first switch branch, and the fourth control signal controlling to turn on or turn off the fourth switch branch;

performing a complementary processing to enable a fifth control signal and a second control signal to be complementary to each other, the fifth control signal controlling to turn on or turn off the fifth switch branch, and the second control signal controlling to turn on or turn off the second switch branch;

performing a complementary processing to enable a third control signal and a sixth control signal to be complementary to each other, the third control signal controlling to turn on or turn off the third switch branch, and the sixth control signal controlling to turn on or turn off the sixth switch branch;

performing a complementary processing to enable a seventh control signal and an eighth control signal to be complementary to each other, the seventh control signal controlling to turn on or turn off the seventh switch branch, and the eighth control signal controlling to turn on or turn off the eighth switch branch; and performing an interlocking processing to enable the first control signal and the second control signal to be interlocked with each other, and performing an interlocking processing to enable the sixth control signal and the fifth control signal to be interlocked with each other.

2. The PWM control method according to claim 1, further comprising:

on reception of a first preset instruction, controlling the first switch branch, the fourth switch branch, the third switch branch, the sixth switch branch, the seventh switch branch and the eighth switch branch to be turned off, controlling the second switch branch to maintain a current state of the second switch branch, and controlling the fifth switch branch to maintain a current state of the fifth switch branch.

3. The PWM control method according to claim 2, further comprising:

on reception of a second preset instruction, controlling the first switch branch, the second switch branch, the third switch branch, the fourth switch branch, the fifth switch branch, the sixth switch branch, the seventh switch branch and the eighth switch branch to be turned off.

4. A control circuit, comprising a first reversing dead zone circuit, a second reversing dead zone circuit, a third reversing dead zone circuit, a fourth reversing dead zone circuit, a first interlocking circuit and a second interlocking circuit, an input terminal of the first reversing dead zone circuit being fed with a first control signal, and an output terminal of the first reversing dead zone circuit outputting a fourth control signal;

an input terminal of the second reversing dead zone circuit being fed with a fifth control signal, and an output terminal of the second reversing dead zone circuit outputting a second control signal;

a first input terminal of the first interlocking circuit being fed with the first control signal, a second input terminal of the first interlocking circuit being connected with the output terminal of the second reversing dead zone circuit, the first interlocking circuit being configured to output the first control signal when the first control signal and the second control signal are valid simultaneously;

an input terminal of the third reversing dead zone circuit being fed with a third control signal;

a first input terminal of the second interlocking circuit being fed with the fifth control signal, a second input terminal of the second interlocking circuit being connected with an output terminal of the third reversing dead zone circuit, the second interlocking circuit being configured to output a sixth control signal when the fifth control signal and the sixth control signal are valid simultaneously; and an input terminal of the fourth reversing dead zone circuit being fed with a seventh control signal, and an output terminal of the fourth reversing dead zone circuit outputting an eighth control signal.

5. The control circuit according to claim 4, further comprising:

a wave blocking circuit connected with a control signal output terminal of the control circuit and configured to control the first control signal, the fourth control signal, the third control signal, the sixth control signal, the seventh control signal and the eighth control signal to be turning-off signals, control the second control signal to maintain a current state of the second control signal, and control the fifth control signal to maintain a current state of the fifth control signal, on reception of a first wave blocking enable signal.

6. The control circuit according to claim 5, wherein the wave blocking circuit is further configured to:
control the first control signal, the second control signal, the third control signal, the fourth control signal, the fifth control signal, the sixth control signal, the seventh control signal and the eighth control signal to be turning-off signals on reception of a second wave blocking enable signal.

7. The control circuit according to claim 5, wherein the wave blocking circuit comprises a first enable circuit, a second enable circuit, a third enable circuit, a fourth enable circuit, a fifth enable circuit, a sixth enable circuit, a seventh enable circuit and an eighth enable circuits, wherein
a first input terminal of the first enable circuit is connected with the output terminal of the first reversing dead zone circuit,
a first input terminal of the second enable circuit is connected with an output terminal of the first interlocking circuit,
a first input terminal of the third enable circuit is connected with the output terminal of the second reversing dead zone circuit,
a first input terminal of the fourth enable circuit is fed with the fifth control signal,
a first input terminal of the fifth enable circuit is connected with an output terminal of the second interlocking circuit,
a first input terminal of the sixth enable circuit is fed with the third control signal,
a first input terminal of the seventh enable circuit is fed with the seventh control signal,
a first input terminal of the eighth enable circuit is connected with the output terminal of the fourth reversing dead zone circuit,
a second input terminal of the first enable circuit, a second input terminal of the second enable circuit, a second input terminal of the fifth enable circuit, a second input terminal of the sixth enable circuit, a second input terminal of the seventh enable circuit and a second input terminal of the eighth enable circuit are fed with the first wave blocking enable signal, and
a third input terminal of the first enable circuit, a third input terminal of the second enable circuit, a third input terminal of the third enable circuit, a third input terminal of the fourth enable circuit, a third input terminal of the fifth enable circuit, a third input terminal of the sixth enable circuit, a third input terminal of the seventh enable circuit and a third input terminal of the eighth enable circuit are fed with a second wave blocking enable signal.

8. The control circuit according to claim 7, wherein the reversing dead zone circuit comprises a delay circuit and a NOT gate, wherein
an input terminal of the NOT gate serves as the input terminal of the reversing dead zone circuit, the delay circuit is connected in series with the NOT gate, and an output terminal of the NOT gate serves as the output terminal of the reversing dead zone circuit.

9. The control circuit according to claim 8, wherein the interlocking circuit comprises an AND gate and an OR gate, wherein a first input terminal of the AND gate is connected with a first terminal of the OR gate, and the terminal at which the first input terminal of the AND gate is connected with the first terminal of the OR gate serves as the first input terminal of the interlocking circuit;
a second input terminal of the AND gate serves as the second input terminal of the interlocking circuit; and
an output terminal of the AND gate is connected with a second input terminal of the OR gate, and an output terminal of the OR gate serves as the output terminal of the interlocking circuit.

10. An inverter, comprising the control circuit according to claim 4.

11. The inverter according to claim 10, wherein the control circuit further comprises:
a wave blocking circuit connected with a control signal output terminal of the control circuit and configured to control the first control signal, the fourth control signal, the third control signal, the sixth control signal, the seventh control signal and the eighth control signal to be turning-off signals, control the second control signal to maintain a current state of the second control signal, and control the fifth control signal to maintain a current state of the fifth control signal, on reception of a first wave blocking enable signal.

12. The inverter according to claim 11, wherein the wave blocking circuit is further configured to:
control the first control signal, the second control signal, the third control signal, the fourth control signal, the fifth control signal, the sixth control signal, the seventh control signal and the eighth control signal to be turning-off signals on reception of a second wave blocking enable signal.

13. The inverter according to claim 11, wherein the wave blocking circuit comprises a first enable circuit, a second enable circuit, a third enable circuit, a fourth enable circuit, a fifth enable circuit, a sixth enable circuit, a seventh enable circuit and an eighth enable circuits, wherein
a first input terminal of the first enable circuit is connected with the output terminal of the first reversing dead zone circuit,
a first input terminal of the second enable circuit is connected with an output terminal of the first interlocking circuit,
a first input terminal of the third enable circuit is connected with the output terminal of the second reversing dead zone circuit,
a first input terminal of the fourth enable circuit is fed with the fifth control signal,
a first input terminal of the fifth enable circuit is connected with an output terminal of the second interlocking circuit,
a first input terminal of the sixth enable circuit is fed with the third control signal,
a first input terminal of the seventh enable circuit is fed with the seventh control signal,
a first input terminal of the eighth enable circuit is connected with the output terminal of the fourth reversing dead zone circuit,
a second input terminal of the first enable circuit, a second input terminal of the second enable circuit, a second input terminal of the fifth enable circuit, a second input terminal of the sixth enable circuit, a second input terminal of the seventh enable circuit and a second input terminal of the eighth enable circuit are fed with the first wave blocking enable signal, and a third input terminal of the first enable circuit, a third input terminal of the second enable circuit, a third input terminal of the third enable circuit, a third input terminal of the fourth enable circuit, a third input terminal of the fifth enable circuit, a third input terminal of the sixth enable circuit, a third input terminal of the seventh enable circuit and a third input terminal of the eighth enable circuit are fed with a second wave blocking enable signal.

14. The inverter according to claim 13, wherein the reversing dead zone circuit comprises a delay circuit and a NOT gate, wherein
   an input terminal of the NOT gate serves as the input terminal of the reversing dead zone circuit, the delay circuit is connected in series with the NOT gate, and an output terminal of the NOT gate serves as the output terminal of the reversing dead zone circuit.

15. The inverter according to claim 14, wherein the interlocking circuit comprises an AND gate and an OR gate, wherein
   a first input terminal of the AND gate is connected with a first terminal of the OR gate, and the terminal at which the first input terminal of the AND gate is connected with the first terminal of the OR gate serves as the first input terminal of the interlocking circuit;
   a second input terminal of the AND gate serves as the second input terminal of the interlocking circuit; and
   an output terminal of the AND gate is connected with a second input terminal of the OR gate, and an output terminal of the OR gate serves as the output terminal of the interlocking circuit.

* * * * *